United States Patent [19]

Eslambolchi et al.

[11] Patent Number: 5,903,221
[45] Date of Patent: May 11, 1999

[54] METHOD AND APPARATUS FOR DETERMINING THE MOISTURE LEVEL IN A BURIED SPLICE

[75] Inventors: Hossein Eslambolchi, Basking Ridge, N.J.; John Sinclair Huffman, McDonough, Ga.

[73] Assignee: AT&T Corp., Middletown, N.J.

[21] Appl. No.: 08/976,651

[22] Filed: Nov. 24, 1997

[51] Int. Cl.[6] .............................. G08B 21/00; G01J 1/04
[52] U.S. Cl. .................. 340/602; 340/605; 340/854.6; 340/854.7; 250/227.15
[58] Field of Search ................................ 340/602, 604, 340/605, 620, 539, 871.16, 601, 854.6, 853.7, 854.8, 854.7, 855.5; 250/227.15, 227.16, 227.21; 455/40, 41

[56] References Cited

U.S. PATENT DOCUMENTS

| | | | |
|---|---|---|---|
| 4,480,251 | 10/1984 | McNaughton et al. | 340/604 |
| 4,754,264 | 6/1988 | Okada et al. | 340/604 |
| 4,866,265 | 9/1989 | Hohne | 250/227.11 |
| 5,077,526 | 12/1991 | Vokey et al. | 324/541 |
| 5,262,639 | 11/1993 | Vokey et al. | 250/227.15 |
| 5,274,359 | 12/1993 | Adams | 340/604 |
| 5,349,182 | 9/1994 | Vokey et al. | 250/227.21 |
| 5,469,146 | 11/1995 | Gurler | 340/605 |
| 5,614,893 | 3/1997 | Ahmad et al. | 340/870.16 |
| 5,708,364 | 1/1998 | Vokey et al. | 324/523 |
| 5,731,990 | 3/1998 | Beck | 364/550 |

OTHER PUBLICATIONS

Sales Literature, NORSCAN, Moisture Detection Tape.

*Primary Examiner*—Jeffrey A. Hofsass
*Assistant Examiner*—Van T. Trieu
*Attorney, Agent, or Firm*—Robert B. Levy

[57] ABSTRACT

The level of moisture in a buried splice case (14) is provided by a transmitter (26) that is energized from a power circuit (24) via a moisture detector (22) when the moisture detector detects a prescribed level of moisture in the splice case. Once erergized, the transmitter (26) transmits a coded word indicative of the prescribed moisture level for receipt by a receiver (30) located above ground. In this way, a technician, using the receiver (30) can directly determine the moisture level in the buried splice case without the necessity to excavate the case or to contact a member of the On-site Work Force at a communications facility.

10 Claims, 2 Drawing Sheets

METHOD AND APPARATUS FOR DETERMINING THE MOISTURE LEVEL IN A BURIED SPLICE

TECHNICAL FIELD

This invention relates to a technique for enabling a technician above ground to remotely monitor the level of moisture associated with a buried splice in an underground cable.

BACKGROUND ART

Many providers of telecommunications services, such as AT&T, maintain large networks of buried fiber-optic cables. Most buried fiber-optic cables have spices every three to five miles. At each splice location, the individual fibers and the metallic sheath of a cable segment are bonded to fibers and sheath, respectively, of another cable segment. A water-resistant metallic enclosure (i.e., a splice case) encloses the splice to protect it from moisture. Each splice case typically lies a distance 5–10 feet underground to protect the splice from possible damage. In practice, great efforts are made to insure each splice case is substantially water-tight. However, moisture can and does enter the splice case, adversely affecting the splice, and ultimately, the quality of the information transmitted by the cable.

Presently, various techniques exist for determining the degree of moisture present in a splice case. For example, an Optical Time Domain Reflectometer (OTDR) can measure the degree of light scattering in a fiber of an optical-fiber cable by transmitting light into one end of the fiber and then measuring the degree to which such light is reflected back to the OTDR. Significant moisture in a splice case will adversely affect the splice, and hence, the light transmission characteristics of the fiber, causing a measurable change in the light backscattering measured by the OTDR. Depending on the type of OTDR making the measurement, it is possible to establish the relative location of a moisture-affected splice in the cable. Alternatively, the splice case may include a mechanical device, such as a bimetallic arrangement in contact with a fiber, for altering the characteristics of the light transmitted through that fiber in response to the level of moisture in the splice case. The variation in the characteristics of the light transmitted through the fiber may also establish the relative location of the moisture-containing splice case.

The above-described techniques for determining the relative level of moisture in a splice case require equipment at a cable termination point, such as a central office or the like, for detecting the variation in the characteristics of the light transmitted through a fiber in the cable. Even assuming the ability of such equipment to accurately establish the relative location of a moisture-affected splice case, such location information is often of limited value to a field technician. Even with such information, the technician must still must manually locate the cable to precisely establish the location of the moisture-affected splice case. Moreover, with the above-described technique, the field technician must communicate with a member of the On-Site Work Force (OWSF) following a measurement by the OTDR, or such other office-based equipment, to learn of a possible impairment of the transmission characteristics of the cable to detect a moisture-affected splice. In the absence of any such communication, a field technician undertaking a routine inspection of a buried fiber-optical cable has no way of determining the relative level of moisture in a splice case.

Thus, there is a need for a technique for determining the level of moisture in a splice case that is not subject to the foregoing disadvantage.

BRIEF SUMMARY OF THE INVENTION

Briefly, the present invention provides a technique for enabling an operator to directly determine the relative level of moisture in a buried enclosure, such as a splice case associated with an underground fiber-optic cable, without the need for assistance of other personnel. In accordance with the invention, the splice case includes a moisture detector that normally provides a relatively high resistance path thereacross until the level of moisture in the splice case reaches a prescribed level. Upon reaching the prescribed level of moisture, the moisture detector completes a circuit to connect a power source to a transmitter, thus energizing the transmitter to transmit a coded signal indicative of the prescribed level of moisture in the splice case. The operator receives the signal above ground, via a receiver, and can thus determine that a prescribed level of moisture is present in the splice case.

DETAILED DESCRIPTION

Figure 1:
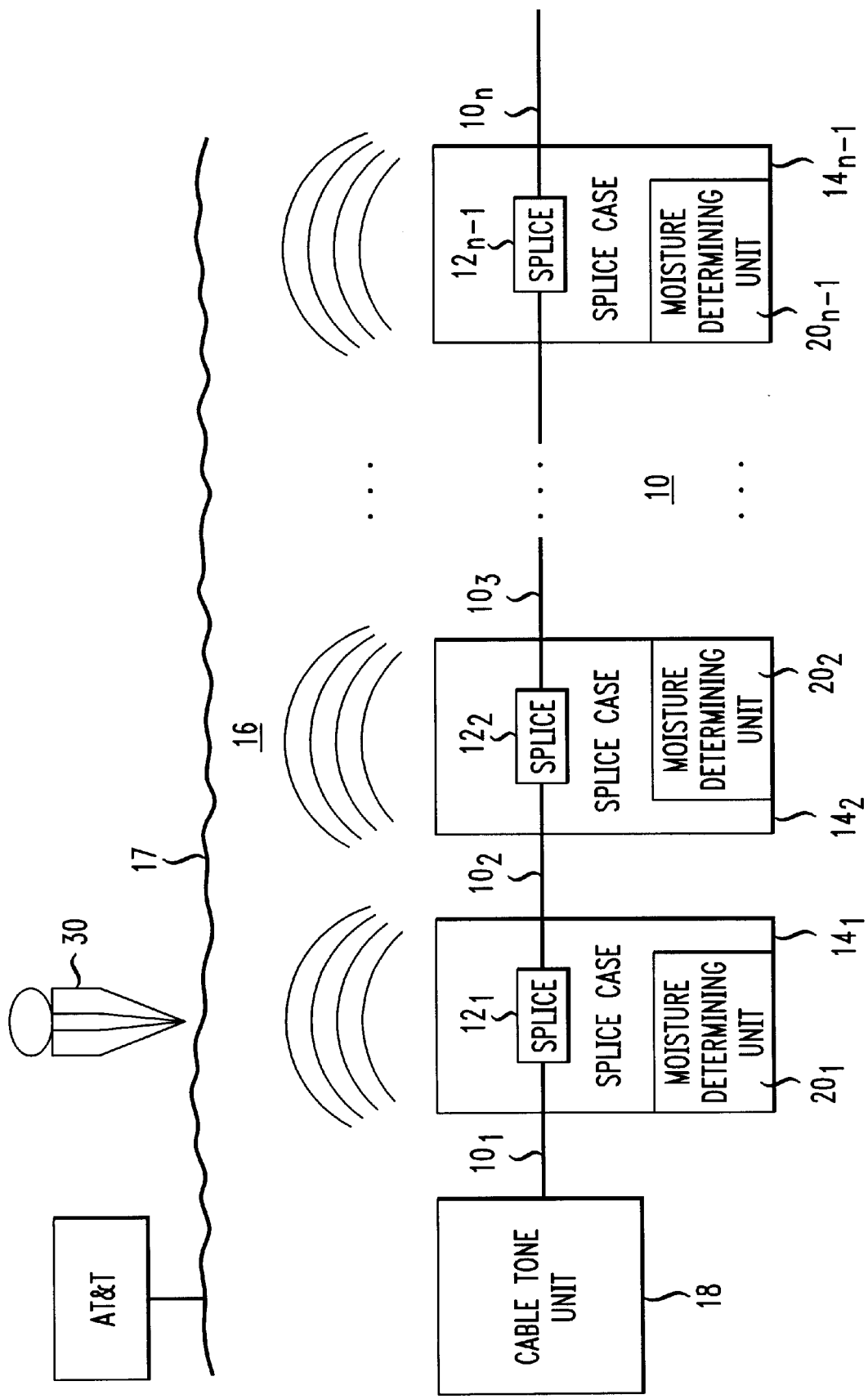
FIG. 1 depicts a buried fiber-optic cable having a plurality of splice locations, each including an apparatus, in accordance with the invention for determining the level of moisture at each splice location.

FIG. 1 depicts a buried fiber-optic cable 10, that in actuality, comprises a plurality of cable segments $10_1$, $10_2$, $10_3 \ldots 10_n$ (where n is an integer greater than one). Each cable segment $10_{i-1}$ (where i is an integer $\geq$n) has its fibers and metallic sheath (not shown) joined to the fibers and sheath, respectively, of an adjacent cable segment $10_i$ by a corresponding one of splices $12_1, 12_2, \ldots 12_{n-1}$. Each of the splices $12_1, 12_2, 12_3 \ldots 12_{n-1}$ is contained within a corresponding one of splice cases $14_1, 14_2, \ldots 14_{n-1}$, respectively, buried in the earth a distance 5–10 feet below ground level, indicated by reference numeral 17.

In practice, each of the splice cases $14_1, 14_2, \ldots 14_{n-1}$ comprises a substantially water-tight metallic enclosure, made from aluminum or the like. While great care is taken to make each splice case water-tight, moisture can and does enter the splice case, ultimately adversely affecting the quality of the splice. Once moisture enters a splice case, corrosion begins, causing the metal sheath to deteriorate. Extreme deterioration of the metal sheath may preclude the sheath from radiating a locating tone impressed on the sheath of the fiber-optic cable 10 by a cable tone unit 18 to facilitate location of the cable in the manner described in our prior U.S. Pat. No. 5,644,237, issued on Jul. 1, 1997 and assigned to AT&T (herein incorporated by reference). Further, deterioration of the sheath reduces the strength of the splice, allowing the fibers to break if the splice is disturbed.

Figure 2:
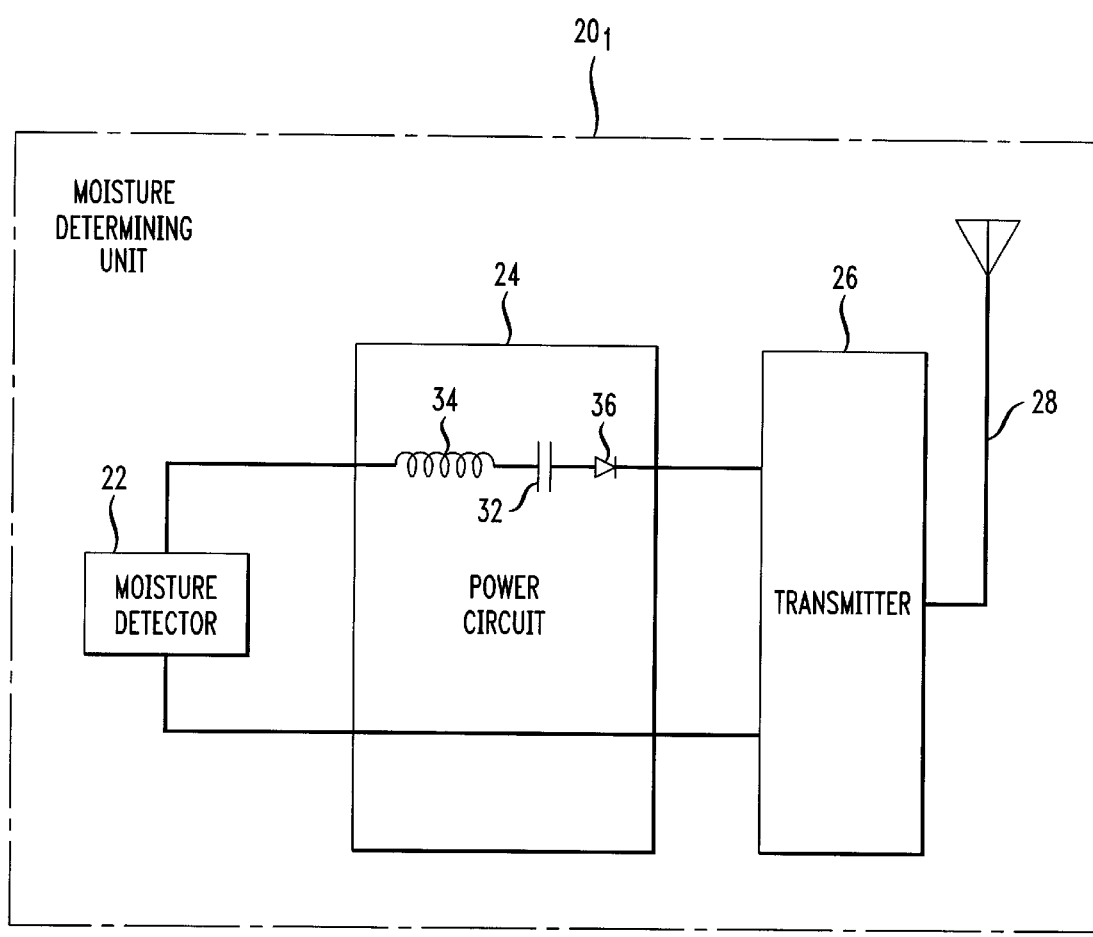
FIG. 2 depicts a block schematic diagram of the apparatus of the invention for determining the moisture level at each of the splice locations of FIG. 1.

Previously, no reliable technique existed for determining from the field the level of moisture in a splice case. The present invention overcomes this disadvantage by providing within each of the splice cases $14_1, 14_2, \ldots 14_{n-1}$ a corresponding one of moisture determining units $20_1$, $20_2, \ldots 20_{n-1}$, respectively. Each of the moisture determining units $20_1, 20_2, \ldots 20_{n-1}$ is substantially identical in its structure and operation, and therefore, only the details of the moisture determining unit $20_1$ are described in FIG. 2. Referring to FIG. 2, the moisture determining unit $20_1$ comprises a moisture-sensitive element 22 that changes its electrical conductivity from a high resistance state to a low resistance state upon the presence of a predetermined level of moisture in a corresponding splice case. The moisture-sensing element 22 may take the form of a well-known moisture sensor whose trigger level is within the range of 10–25%.

Upon reaching its moisture trigger level, the moisture-sensing element 22 provides a low resistance path thereacross to couple a power circuit 24 to a transmitter 26. The power circuit 24 provides electrical power to power the transmitter 26, which when energized, transmits, via antenna a coded signal at a frequency that is close in range to the frequency of the locating signal to be generated by the tone unit 18. In this way, a technician employing a receiver 30 (See FIG. 1) of the type used to detect the locating tone impressed on the sheath of the fiber-optic cable 10 by the tone unit 18 (See FIG. 1) for locating purposes, can detect, by slightly adjusting the frequency of the receiver, the coded word transmitted by the transmitter 26. Thus, using the same receiver 30, the technician can locate the fiber-optic cable 10, as well as obtain an indication of the level of moisture in each of the splice cases $14_1$, $14_2$, . . . $14_{n-1}$.

In the illustrated embodiment, the power circuit 24 advantageously derives a sufficient voltage for powering the transmitter 26 from the energy radiated by the locating signal on the sheath of the fiber-optic cable 10. To that end, the power circuit 24 includes an L-C circuit, comprised of capacitor 32 and an inductor 34, tuned to the frequency of the locate signal impressed on the fiber-optic cable 10 of FIG. 1 by the tone unit 18 of FIG. 1. The locate signal induces energy in the L-C circuit that is rectified by a diode 36 to yield a voltage for energizing the transmitter 26. While the L-C of FIG. 2 comprises a single capacitor 32 and inductor 34, the L-C could be configured of additional circuitry designed to derive energy from the locate signal on the fiber-optic cable 10. Likewise, while the power circuit 24 is described as containing a single diode 36, a full-wave bridge or half-wave bride, or other rectification circuitry could be employed.

In practice, each splice case includes at least moisture determining unit of the type described with respect to FIG. 2. In some circumstances, it may be desirable to provide two or more such units, each having a different moisture threshold. For example a splice case could contain two moisture-determining units having moisture thresholds of 10% and 25%. Upon reaching its preselected moisture threshold, each moisture-determining unit would transmit a coded signal indicative of the particular moisture threshold. Thus, a technician using the receiver 30 could determine whether the splice case had a level of 10% or 25% moisture, in accordance with the particular coded received from the splice case. Using that knowledge, the technician could take appropriate action. For example a splice case having a 10% moisture level may require further moisture evaluation within a given interval, whereas a splice case having a 25% moisture level would likely require immediate replacement The foregoing describes a technique for directly determining the level of moisture in splice case.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for determining the level of moisture in a buried enclosure, comprising the steps of:

sensing when the level of moisture in the enclosure is at least equal to a first prescribed level, and upon the moisture reaching said prescribed level, energizing a first transmitter within the enclosure to transmit via a wireless transmission a first coded signal indicating the first prescribed level of moisture is present within the enclosure; and receiving the first transmitted signal above ground to enable an operator in proximity to the enclosure to determine that the enclosure has a level of moisture at least equal to the first prescribed level.

2. The method according to claim 1 wherein the buried enclosure comprises a splice case that encloses a splice in a buried fiber-optic cable that carries a locating tone and wherein the transmitter is energized from the locating tone on the fiber-optic cable.

3. The method according to claim 1 wherein the step of sensing the level of moisture comprises the step of completing an electrical circuit between the transmitter and a power source when the level of moisture in the enclosure at least equals the prescribed level.

4. The method according to claim 1 further including the steps of:

sensing when the level of moisture in the enclosure is at least equal to a second prescribed level, and upon the moisture reaching said second prescribed level, energizing a second transmitter within the enclosure to transmit a second coded signal indicating the second prescribed level of moisture is present within the enclosure; and receiving the second transmitted signal above ground to enable an operator in proximity to the enclosure to determine that the enclosure has a level of moisture at least equal to the second prescribed level.

5. The method according to claim 4 wherein the first prescribed level of moisture is 10%.

6. The method according to claim 4 wherein the second prescribed level of moisture is 25%.

7. Apparatus for determining the percentage of moisture in an enclosure, comprising:

a first transmitter within the enclosure;

a power circuit;

means for sensing when the level of moisture in the enclosure is at least equal to a first prescribed level, and upon the moisture reaching said prescribed level, coupling said transmitter to said power circuit to energize said transmitter to cause it to transmit via a wireless transmission a coded word indicative of said first prescribed moisture level; and, means for receiving the first transmitted signal above ground to enable an operator in proximity to the enclosure to determine that the enclosure has a level of moisture at least equal to the first prescribed level.

8. The apparatus according to claim 7 wherein the sensing means comprises means for providing low resistance path thereacross when the level of moisture in said enclosure at least equals said first prescribed level.

9. The apparatus according to claim 7 wherein said enclosure comprises a splice case enclosing a splice in a fiber-optic cable that carries a locating tone and wherein the power circuit derives energy from the locating tone on the fiber-optic cable to energize the transmitter.

10. The apparatus according to claim 9 wherein the receiver also receives the locating tone on the fiber-optic cable.

* * * * *